United States Patent [19]
Lüder et al.

[11] Patent Number: 5,642,117
[45] Date of Patent: Jun. 24, 1997

[54] PROCESS AND APPARATUS FOR CONVERSION OF AN N-BIT DIGITAL DATA WORD INTO AN ANALOG VOLTAGE VALUE

[76] Inventors: Ernst Lüder, Pfaffenwaldring 47, 70569 Stuttgart; Stefan Kull, Arnold-Cahn-Weg 8, 70374 Stuttgart, both of Germany

[21] Appl. No.: 523,477

[22] Filed: Sep. 5, 1995

[30] Foreign Application Priority Data

Sep. 9, 1994 [DE] Germany .......................... 44 32 065.5

[51] Int. Cl.$^6$ ................................................. H03M 1/50
[52] U.S. Cl. ................................. 341/152; 341/144
[58] Field of Search .................................. 341/152, 144

[56] References Cited

U.S. PATENT DOCUMENTS

| | | | |
|---|---|---|---|
| 3,267,429 | 8/1966 | Strohmeyer | 341/152 |
| 3,422,423 | 1/1969 | Kaszynski et al. | 341/152 |
| 3,594,765 | 7/1971 | Maurepas et al. | 341/152 |
| 3,648,275 | 3/1972 | Bower | 341/152 |
| 4,139,840 | 2/1979 | Mogi | 340/347 |

OTHER PUBLICATIONS

R.G. Stewart, et al, "A 9V Polysilicon LCD with Integrated Gray–Scale Drivers", SID 90 Digest, 1990, pp. 319–322.

*Primary Examiner*—Jeffrey A. Gaffin
*Assistant Examiner*—Jason H. Vick
*Attorney, Agent, or Firm*—Michael J. Striker

[57] ABSTRACT

The process of converting a digital data word having N-bits into an analog voltage value includes decrementing or incrementing a counter word (B) having N-bits from a respective maximum or minimum value to form a series of decremented or incremented values, synchronizing the decrementing or incrementing of the counter word (B) to a time course of an analog reference voltage ($U_{ramp}$) having a ramp-shaped time dependence, evaluating a logical connection function of the decremented or incremented values of the counter word (B) with a digital data word (A) to determine when one of the decremented or incremented values of the counter word (B) is equal to a complement of the digital data word (A) and setting an output analog voltage value ($U_{column}$) equal to the analog reference voltage ($U_{ramp}$) as soon as the decremented or incremented value of counter word (B) equal to the complement of data word (A) is reached.

22 Claims, 8 Drawing Sheets

| EXEMPLARY DATA WORD A | DATA WORD B | RESULT OF BITWISE NAND-COUPLING OF A AND B |
|---|---|---|
| $1010_{bin}$ | $1111_{bin}$ | $0101_{bin}$ |
| dto. | $1110_{bin}$ | $0101_{bin}$ |
| dto. | $1101_{bin}$ | $0111_{bin}$ |
| dto. | $1100_{bin}$ | $0111_{bin}$ |
| dto. | $1011_{bin}$ | $0101_{bin}$ |
| dto. | $1010_{bin}$ | $0101_{bin}$ |
| dto. | $1001_{bin}$ | $0111_{bin}$ |
| dto. | $1000_{bin}$ | $0111_{bin}$ |
| dto. | $0111_{bin}$ | $1101_{bin}$ |
| dto. | $0110_{bin}$ | $1101_{bin}$ |
| dto. | $0101_{bin}$ | $1111_{bin}$ |
| dto. | $0100_{bin}$ | $1111_{bin}$ |
| dto. | $0011_{bin}$ | $1101_{bin}$ |
| dto. | $0010_{bin}$ | $1101_{bin}$ |
| dto. | $0001_{bin}$ | $1111_{bin}$ |
| dto. | $0000_{bin}$ | $1111_{bin}$ |

FIG. 3

PROCESS AND APPARATUS FOR CONVERSION OF AN N-BIT DIGITAL DATA WORD INTO AN ANALOG VOLTAGE VALUE

BACKGROUND OF THE INVENTION

The invention relates to a process and apparatus for conversion of an N-bit digital data word into an analog voltage value by comparing the digital data word with an analog reference voltage with a ramp-shaped time dependence.

Digital-to-analog conversions are performed in number of control applications and in telecommunication. The digital control of data conductors or lines of a liquid crystal display screen is a special field of application. The so-called "active-matrix liquid crystal display screens", also abbreviated as AM-LCDs, will in the future increasingly replace the conventional display screens having cathode ray tubes because of a number of advantages for television and data processing fields. The possibility of distortion-free production of an image, reduced control voltages, and, as a result of a reduced power requirement, a high resolution, the absence of X-radiation and strong magnetic fields in the outer field of the display screen and the possibility of manufacture in an economical technology can be added to the advantages of a flat and light structure that are inherent in the liquid crystal display screens. Liquid crystal display screens can also be used as light valves in a projector for video screens having a large scale format.

Liquid crystal display screens comprise a plurality of matrix-like image points, each image point being associated with a circuit element. Thin film transistors are frequently used as the circuit elements. The screen information is applied to column conductors and written line-wise into the image point memory by the circuit elements. Thus the n row conductors must be controlled so that only one line conductor of the entire n lines of the image point has a sufficiently high potential for 1/n-th of the image duration so that the image point capacitor can be charged at the data voltage corresponding to the image point information by the circuit element. During the balance of the image scan time, in which a line is not selected, the image point capacitor must not be discharged by the circuit element. This is accomplished by control of the line with a sufficiently reduced voltage.

Different methods are already known for control of the column conductors in a compatible technology for making a liquid crystal display screen. Both analog control circuits and also digital control circuits are used for that. The image point information is present in the digital control circuits, e.g., as gray values in digital code, and is converted by a digital/analog converter into an analog voltage value. A digital/analog conversion with the help of an analog voltage ramp (i.e. a voltage having a ramp-like time dependence), which is connected by switch elements to each of the column conductors of the display screen, is described in R. G. Stewart, et al.: 1990 SID Symposium Digest, pp. 319 to 322. The switch elements connecting the reference voltage having the ramp-like time dependence and the column conductors are first closed, i.e. the column voltages follow the ramp voltages. A digital counter, which was loaded at an earlier time with a data word containing the image point information of the concerned column, is incremented for each column synchronously with the analog ramp voltage. This data word then determines the time point at which the counter reaches its maximum value and thus the time point for opening of the concerned switch element. The column voltages remain after that at the ramp voltage values occurring at the opening of the switch elements.

A great advantage of the digital/analog conversion with the aid of an analog reference voltage having the ramp-like time dependence is that the conversion characteristic line, i.e. the correlation of the analog voltage values to each digital data words, is nearly arbitrarily selectable, since the time course of the ramp-like reference voltage is varied. The principle used by R. G. Stewart is generally connected with a very high circuit expense. Thus for each column N+i switch elements, a flip-flop and an N-bit counter are required. The flip-flops and the counters are particularly expensive.

SUMMARY OF THE INVENTION

It is an object of the present invention to optimize digital/analog conversion by means of an analog reference voltage having a ramp-like time dependence so that as little circuitry expense as possible is required.

According to the present invention the method for digital/analog conversion of the above-described type comprises the steps of decrementing or incrementing a counter word (B) having N-bits from a respective maximum or minimum value to form a series of decremented or incremented values; synchronizing the decrementing or incrementing of the counter word (B) to a time course of a reference voltage ($U_{ramp}$) having a ramp-shaped time dependence, evaluating a bit-wise logical connection function of the decremented or incremented values of the counter word (B) with a digital data word (A) to determine when one of the decremented or incremented values of the counter word (B) is equal to a complement of the digital data word (A) and setting an output analog voltage value ($U_{column}$) equal to the reference voltage ($U_{ramp}$) as soon as the decremented or incremented value of counter word (B) equal to the complement of data word (A) is reached.

The circuit arrangement for performing this process requires only N logic gate components of the same type and an analyzer circuit for the output signals of the N gates, whose output signals control the setting of the analog output voltage value equal to the reference voltage value as determined by the above-described process according to the invention. In a preferred embodiment the analyzer circuit can have at least one capacitor and N+3 circuit components besides the at least one capacitor. The analyzer circuit can for example include transistors.

Instead of the obvious, although comparatively expensive bit-wise equivalent comparison of a digital data word and a counter word, in the process according to the invention a value of a simple bit-wise logical connection function of both words is determined while the counter word is incremented from a minimum value or decremented from a maximum value. The following mathematical theorems are used for this:

1. "If A and B are two N-digit binary numbers, then B=complement of A is the largest N-digit binary number for which evaluation of a bit-wise NAND-logical connection function of A and B results in a logical "1" at the output of each NAND-gate used to perform the logical connection and/or for which evaluation of a bit-wise AND-logical connection function results in a logical "0" at the output of each AND-gate used to perform the logical connection in a bit-wise manner."

2. "If A and B are two N-digit binary numbers, then B=complement of A is the smallest N-digit binary number for which evaluation of a bit-wise OR-logical connection function results in a logical "1" at each OR-gate used to perform the logical connection and/or for which evaluation of a bit-wise NOR-logical connection function results in a logical "0" at each NOR-gate used to perform the logical connection in a bit-wise manner."

Mathematical theorem 1 may be proven as follows:

Provided A and B are two binary numbers with N-bits each $$A = \sum_i a_i 2^i$$

$$B = \sum_i b_i 2^i$$

wherein $a_i$, $b_i \in \{0,1\}$, then the bit-wise NAND-connection function of both numbers A and B becomes "11.1", thus $$\overline{A \cdot B} = \text{``11.1''}$$

or in another formulation $$\overline{a_i \cap b_i} = 1 \text{ for all } i \in \{0,1, \ldots, N-1\},$$

under the condition that $$((a_i=0) \wedge b_i \in [0,1]) \vee ((a_i=1) \wedge (b_i=0)).$$

Thus it is not difficult to see that, with a given N-digit A with $$A = \sum_k a_k 2^k + \sum_j a_j 2^j = \sum_i a_i 2^i,$$

wherein without limitation of the generality:

$a_k=1$; $a_j=0$; with k not equal to j and k,j $\in \{0,1, \ldots, N-1\}$, for the largest N-digit B, $$B = \sum_k b_k 2^k + \sum_j b_j 2^j$$

$$= \sum_i b_i 2^i$$

which for all $i \in \{0,1, \ldots, N-1\}$ fulfills the condition $\overline{a_i \cap b_i} = 1$, the following conditions result 1. $b_k = \overline{a_k}$ (necessarily in order that the condition $\overline{a_k \cap b_k} = 1$ is fulfilled),
2. $b_j = \overline{a_j}$ (because $a_j$ not necessarily=0, in order to fulfill the condition that $\overline{a_j \cap b_j} = 1$, however necessary to obtain the largest B which fulfills the latter condition), i.e. $b_i = \overline{a_i}$ for all $i \in \{0,1, \ldots, N-1\}$.

The second embodiments of theorem 1 and theorem 2 may be similarly derived from the above proof using the relationships $\overline{a_i \cap b_i} = (\overline{a_i \cap b_i})$ for an AND logical connective function, $\overline{a_i \cap b_i} = \overline{a_i} \cup \overline{b_i}$ for an OR logical connective function, and $\overline{a_i \cap b_i} = (c_i \cup d_i)$ wherein $c_i = \overline{a_i}$ and $d_i = \overline{b_i}$ for the NOR logical connection function.

Because of the validity of these theorems, which can be verified also with aid of the Table shown in FIG. 3 hereinbelow for the NAND logical connection function, it is guaranteed that on incrementing or decrementing the counter as soon as the counter word corresponds to the complement of the digital data word for the first time during the counting process all outputs of the logic gates simultaneously are either at logic "1" or logic "0", i.e. they are all the same. The value of the reference voltage obtained at this time is subsequently output as the analog voltage value corresponding to the digital data word. Of course the outputs of the gate during further counting of the counter may reach a state in which they are again all logic "1" or logic "0", but this repeat state is however not evaluated or analyzed, i.e. used to produce an output analog voltage.

The expense reduction attained by the circuit arrangement according to the invention is above all, because of theorems 1 and 2, based on the use of the simplest logic gates such as AND, NAND, OR or NOR which can be constructed with comparatively few circuit components.

The circuit arrangement for performing the obvious process of evaluating a bit-wise equivalent logic connection function of data word and counter word requires 3N NAND gates and 2N inverts in contrast to the circuit arrangement according to the invention having only N logic gates and the analysis circuit with a capacitor and at most N+3 additional circuit components. This results in a considerable expense reduction for the circuit arrangement of the invention in contrast to that of the prior art.

Additional advantages result when the reference voltage having the ramp-shaped time dependence is nonlinear. Since the time intervals between counting events during decrementing or incrementing of the counter are equal, the voltage differences between the corresponding analog voltage values are also equal when a linear ramp voltage is used. However when a nonlinear ramp voltage is used a higher sensitivity for analog evaluation results in certain voltage regions according to the shape and slope of the nonlinear ramp voltage. Several reference voltage functions with different time dependencies can be made available and selected according to choice of the operator. In contrast to other digital/analog conversion processes the converter characteristic line is easy to vary in the process according to the invention. The circuit arrangement for performing the method according to the invention can be made by thin film technology methods. It is suitable for use in a digital control circuit for the data conductors of a liquid crystal display screen with matrix-like arrangement of image points, which besides a circuit arrangement according to the invention has a memory for a digital data word for each conductor and a counter connected with all circuit arrangements of the data conductors. One such digital control circuit in contrast to the known control circuit of this type has the advantage that only one counter is required for the collective data conductors of the display screen. The control circuit can advantageously be included with the image point matrix of the liquid crystal display screen in a common substrate and can be made in a common thin film technology method. Because of that, only a comparatively small area of the substrate is taken because of the use of the digital/analog converter according to the invention which has comparatively few components. The counter which is common for all data conductors must not be integrated in the substrate.

BRIEF DESCRIPTION OF THE DRAWING

The objects, features and advantages of the present invention will now be illustrated in more detail by the following detailed description, reference being made to the accompanying drawing in which:

FIG. 3 is a tabular illustration of the bit-wise NAND-connective function of a data word with a counter word;

DESCRIPTION OF THE PREFERRED EMBODIMENTS

Figure 1:
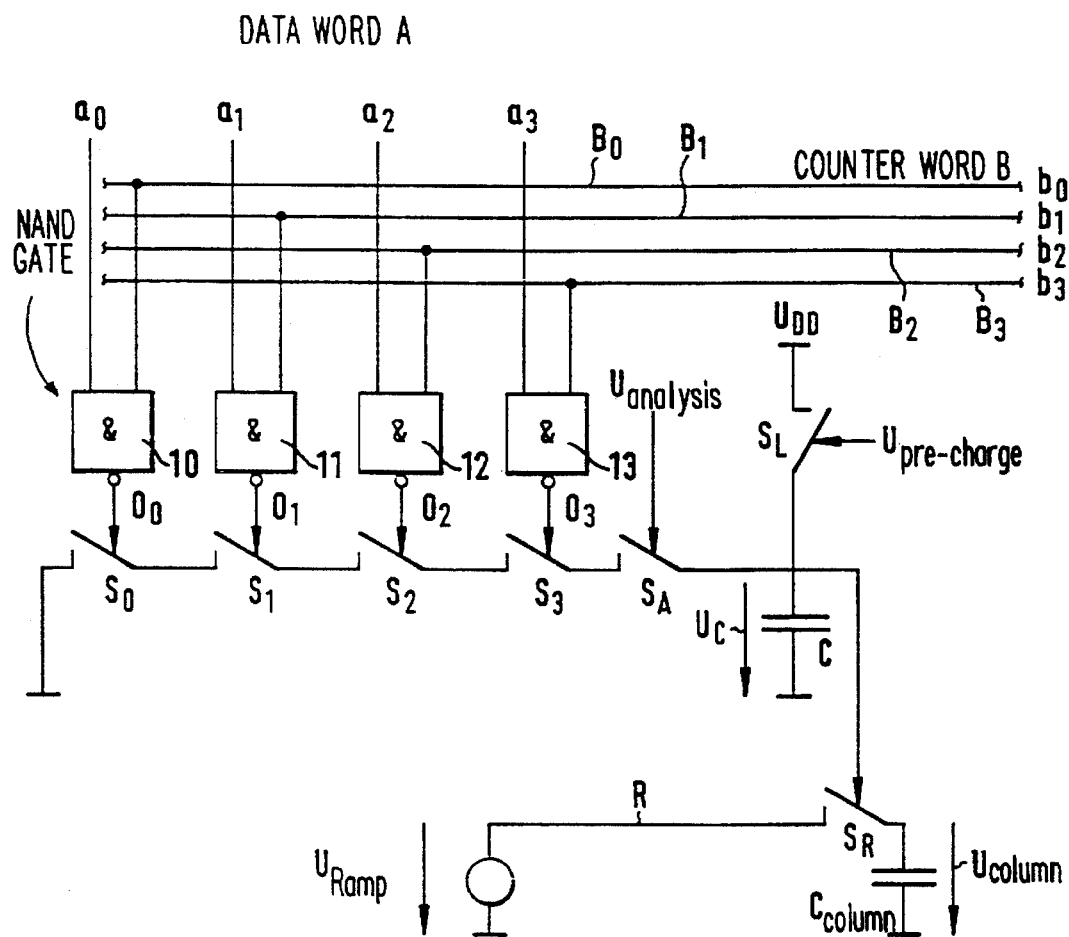
FIG. 1 is a generalized main schematic circuit diagram of a circuit device according to the invention.

The digital/analog converter shown in FIG. 1 has an N=4 NAND gate comprising four NAND gate elements 10, 11, 12 and 13, each of which has a first input and a second input. A bit $a_0$ of a data word A is supplied to the first input of the first NAND gate element 10, a bit $a_1$ of the data word A is supplied to the first input of the second NAND gate element 11, a bit $a_2$ of the data word A is supplied to the first input of the third NAND gate element 12 and a bit $a_3$ is supplied to the first input of the fourth NAND gate element 13. In a similar way a bit $b_0$ of a counter word stored in an unshown counter is supplied to the second input of the first NAND gate element 10 via conductor $B_0$, a bit $b_1$ of the counter word is supplied to the second input of the second NAND gate element 11 via conductor $B_1$, a bit $b_2$ of the counter word is supplied to the second input of the third NAND gate element 12 via conductor $B_2$ and a bit $b_3$ of the counter word is supplied to the second input of the fourth NAND gate element 13 via conductor $B_2$. While the data word A is read in from an unshown memory, a capacitor C of the digital/analog converter is charged at the battery voltage $U_{DD}$ by action of the switch $S_L$. Because of that a switch $S_R$ is closed and the output voltage of the digital/analog converter $U_{column}$ is electrically connected by it with a conductor R, which is connected to a ramp-shaped reference voltage $U_{ramp}$, i.e. a reference voltage having a ramp-shaped time dependence. A switch $S_A$ is open at this stage and thus prevents a discharging of the capacitor C. When the data word A is completely read in, the digital/analog conversion starts. The reference voltage $U_{ramp}$ runs through the entire range from a minimum value $U_{min}$ to a maximum value $U_{max}$. The different voltage values correspond to different gray values produced on a liquid crystal display screen. As soon as the voltage ramp $U_{ramp}$ starts to increase, the counter word B is decremented from its maximum value "1111". Depending on the actual state of the counter the individual counter conductors $B_0$, $B_1$, $B_2$, $B_3$ are either at a high or low potential. When the outputs of the collective NAND-gate 10 to 13 are in the activated or switch-closing state, the charging of the capacitor C on transition from one to the next counter state is prevented by the switch $S_A$ which is always first set in the closed condition. If the counter word B takes the value of the complement $\overline{A}$ of the data word A, a logical "1" is simultaneously present on the outputs $O_0$ to $O_3$ of the NAND-gate 10 to 13 for each of the four bits at a first occurrence during the digital/analog conversion stage.

Switches $S_0$ to $S_3$ are then closed for each bit because of that. Furthermore the switch $S_A$ is closed so that the capacitor C can be charged. The switch $S_R$ opens whereby the voltage value of the reference voltage $U_{ramp}$ reached prior to the opening of the switch $S_R$ remains applied to a capacitor $C_{column}$ of a display screen conductor as the voltage value $U_{column}$. $U_{column}$ is thus the analog voltage value corresponding to the digital data word A.

The circuit shown in FIG. 1 can be manufactured in thin film technology using the standard materials used in this type of technology, such as polycrystalline semiconductor material, e.g. polycrystalline silicon or amorphous semiconductor material such as amorphous silicon. In the example shown in FIG. 1 the digital/analog converter is provided for controlling a column of a liquid crystal display screen. However all other purposes of a digital/analog converter can be accomplished with the circuit shown in FIG. 1.

Figure 2:
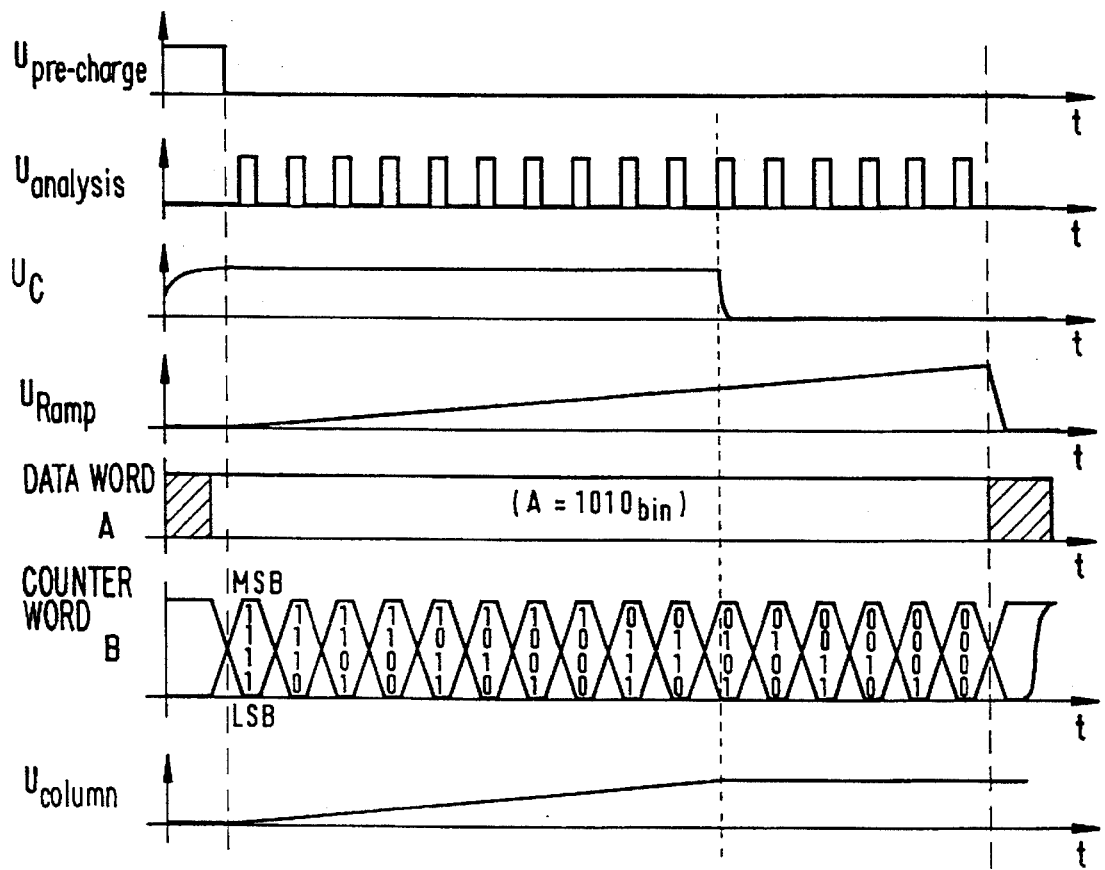
FIG. 2 is a graphical illustration of the time dependencies of voltages at various points in the circuit device shown in FIG. 1.

The time evolution of various voltages at various points in the circuit shown in FIG. 1 are shown in FIG. 2. First the capacitor voltage $U_c$ is charged to the battery voltage $U_{DD}$ and is maintained constant at this value. Then the individual digital/analog conversion begins by increasing the reference voltage $U_{ramp}$ and simultaneously decrementing the counter word B from its maximum value "1111". The analog voltage value $U_{column}$ at the output of the circuit runs parallel with the voltage $U_{ramp}$ until the counter word B corresponds to the complement of the data word A. In the example A=$1010_{bin}$, i.e. the complement $\overline{A}$ is $0101_{bin}$. As soon as the counter word B reaches this value all the NAND gate outputs are at logical level "1" and at the same time the switches $S_0$ to $S_3$ and the switch $S_A$ are then closed, so that the capacitor C can be charged. Simultaneously the switch $S_R$ opens and because of that the output voltage $U_{column}$ keeps that voltage value $U_{ramp}$ achieved at that time.

In FIG. 3 a truth table is shown for a NAND logic connection function of two digital words A and B. The exemplary data word A $1111_{bin}$. As soon as the counter word reaches the value $0101_{bin}=\overline{A}$, the result of the NAND logical connective of A and B is $1111_{bin}$. This value is of course achieved three times in additional decrementing of the counter word B, however then the digital/analog conversion is already prevented, i.e. the capacitor C is again discharged and $U_{column}$ itself can no longer be changed.

Figure 4:
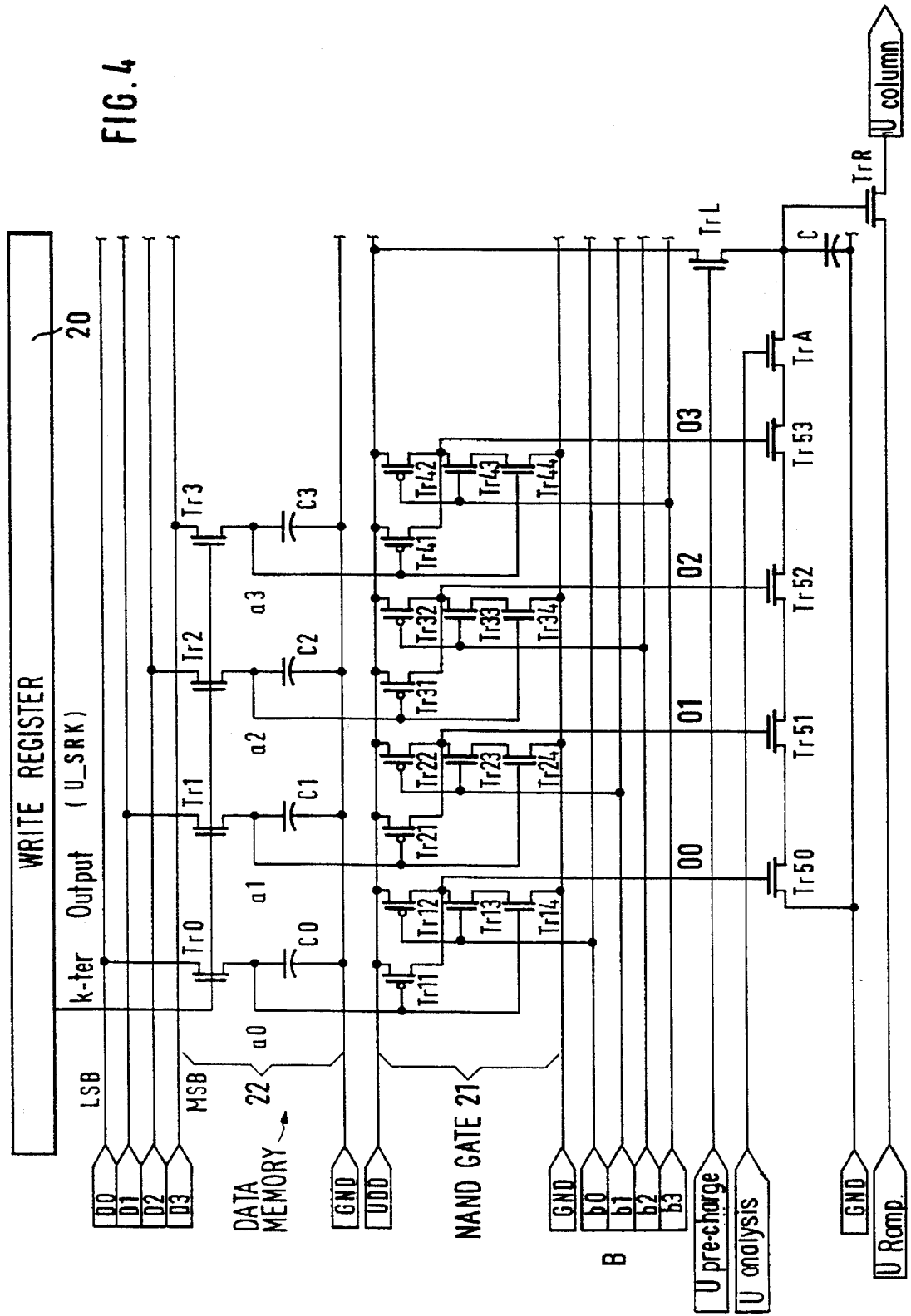
FIG. 4 is a schematic circuit diagram of one embodiment of a controller circuit of a data conductor of a liquid crystal display screen.
Figure 5:
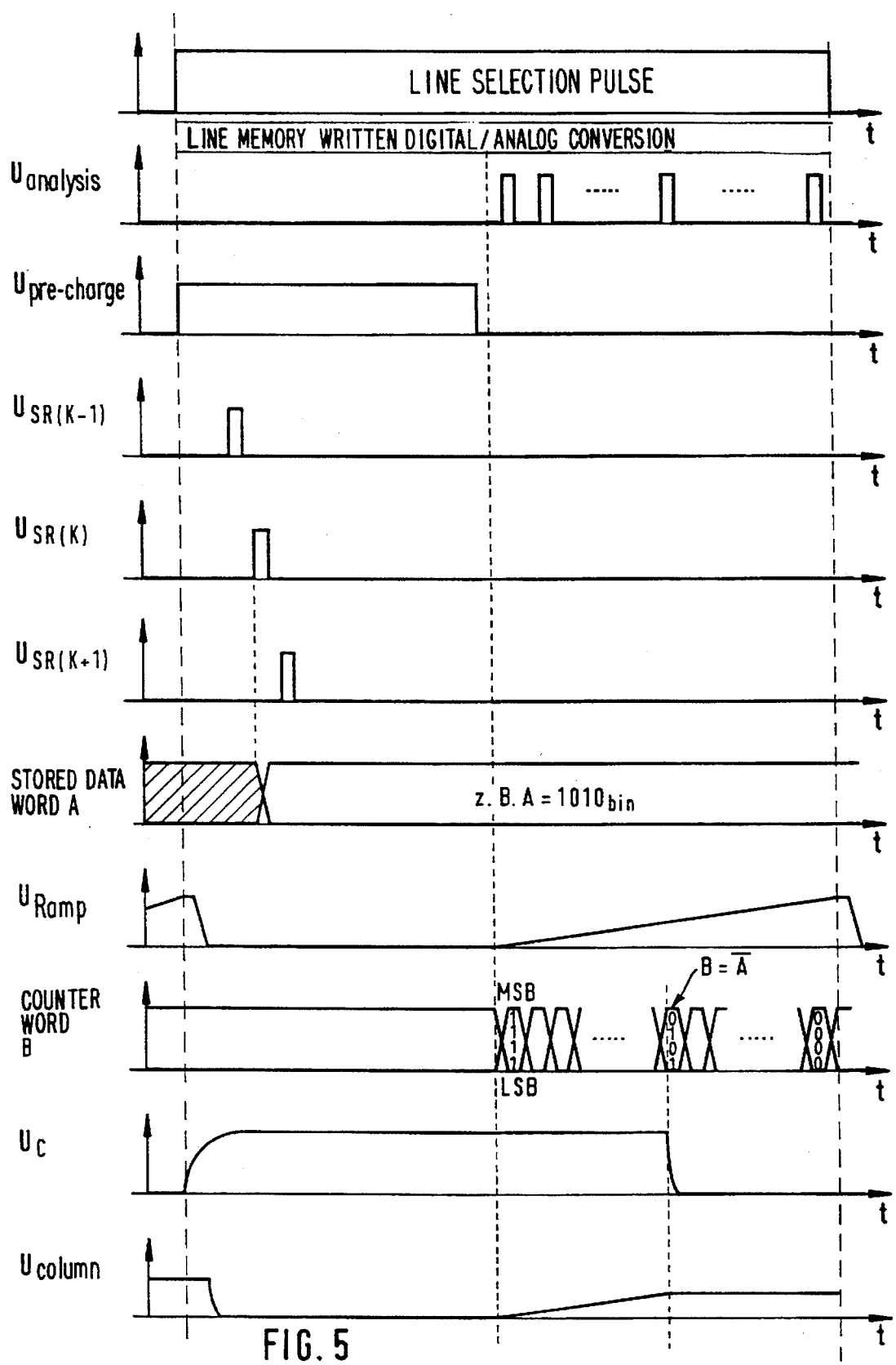
FIG. 5 is a graphical illustration of the time dependencies of voltages at various points in the controller circuit shown in FIG. 4.

FIG. 4 shows a circuit for control of a column of a liquid crystal display screen. An N=4 NAND gate 21 is again illustrated, which is made by thin film transistors. The bits $a_0$ to $a_3$ of a data word A reside in a data memory 22. The data memory 22 is written with the help of a write register 20 with bits $a_0$, $a_1$, $a_2$, $a_3$ fed over respective data conductors $D_0$ to $D_3$. The data word A codes the gray value which should control a column of a liquid crystal display screen as analog value $U_{column}$. When the outputs of the write register 20 have a high voltage, the memory capacitors $C_0$ to $C_3$ are charged by the transistors Tr0 to Tr3 to the momentary voltage on the data conductors $D_0$ to $D_3$. While the data memory 22 is written, the pre-charge voltage $U_{pre-charge}$ has a high value. Because of that the capacitance C is charged to the voltage $U_{DD}$, which is high enough so that the transistor TrR becomes conducting. Because of that, the associated column of the liquid crystal display screen is connected electrically with the conductor R, which carries the ramp-shaped reference voltage $U_{ramp}$. The column voltage $U_{column}$ thus follows the ramp voltage $U_{ramp}$. During the write stage of the data word A in the memory 22, the analysis voltage $U_{analysis}$ has a low value, so that the transistor TrA is blocked. Thus an undesirable discharging of the capacitor C is reliably avoided. When the columns of the lines of memory are collectively written, the digital/analog conversion phase begins. The ramp voltage $U_{ramp}$ begins by running through the range from $U_{min}$ to $U_{max}$. Simultaneously an external counter B is started, which is decremented from its maximum value $1111_{bin}$ to the value $0000_{bin}$. The data word A and the counter word B are processed by the NAND-gate 21. If the condition B=$\overline{A}$ is fulfilled, the outputs $O_0$ to $O_3$ of the NAND gate 21 are at a high voltage level for each bit so that the transistors Tr50 to Tr53 acting as switches are made conductive. As soon as the value $U_{analysis}$ has switched to a high level, the transistor TrA conducts, so that the capacitor C can discharge through the transistors Tr50 to Tr53 and TrA. The transistor TrR blocks, whereby the voltage value $U_{column}$ reached previously remains on the column until a new line selection pulse causes the opening of all image point switches. The voltage value $U_{column}$ is thus maintained for an image scanning time in the image point memory. The time behavior of the voltages at various points in the circuit shown in FIG. 4 is illustrated in FIG. 5 and is similar to that illustrated in FIG. 2 and thus is not described in detail here.

Figure 6:
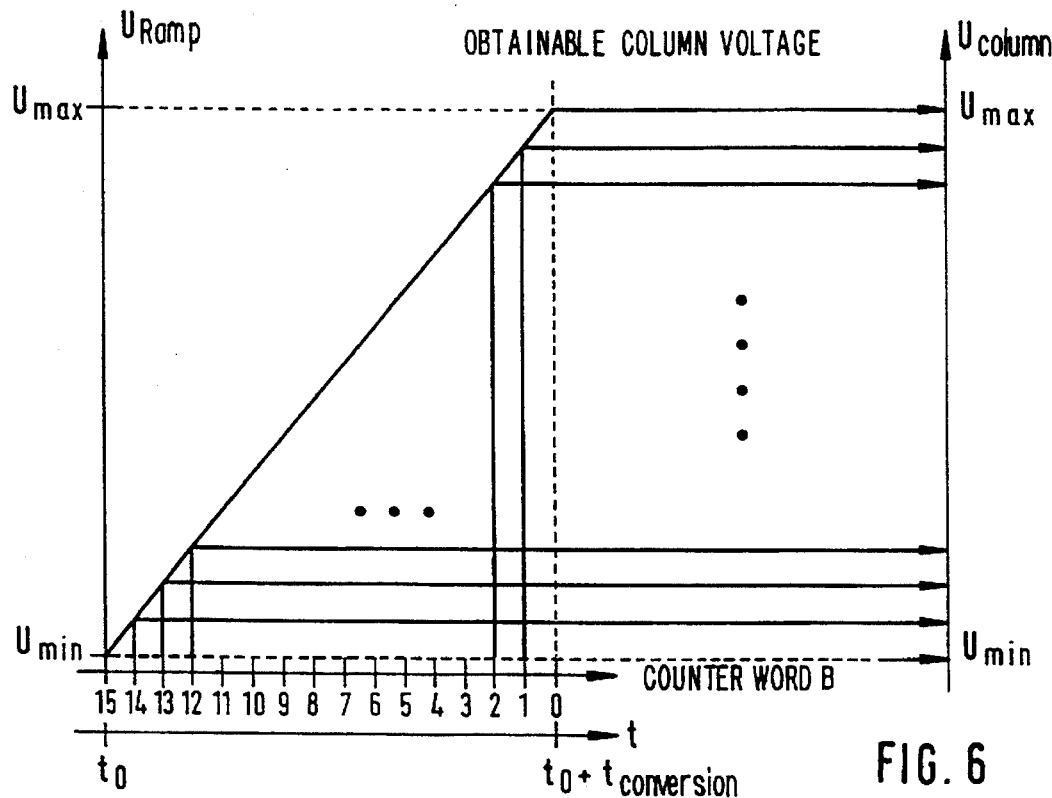
FIG. 6 is a graphical illustration of the time dependence of a reference voltage having a linear ramp-like time dependence.
Figure 7:
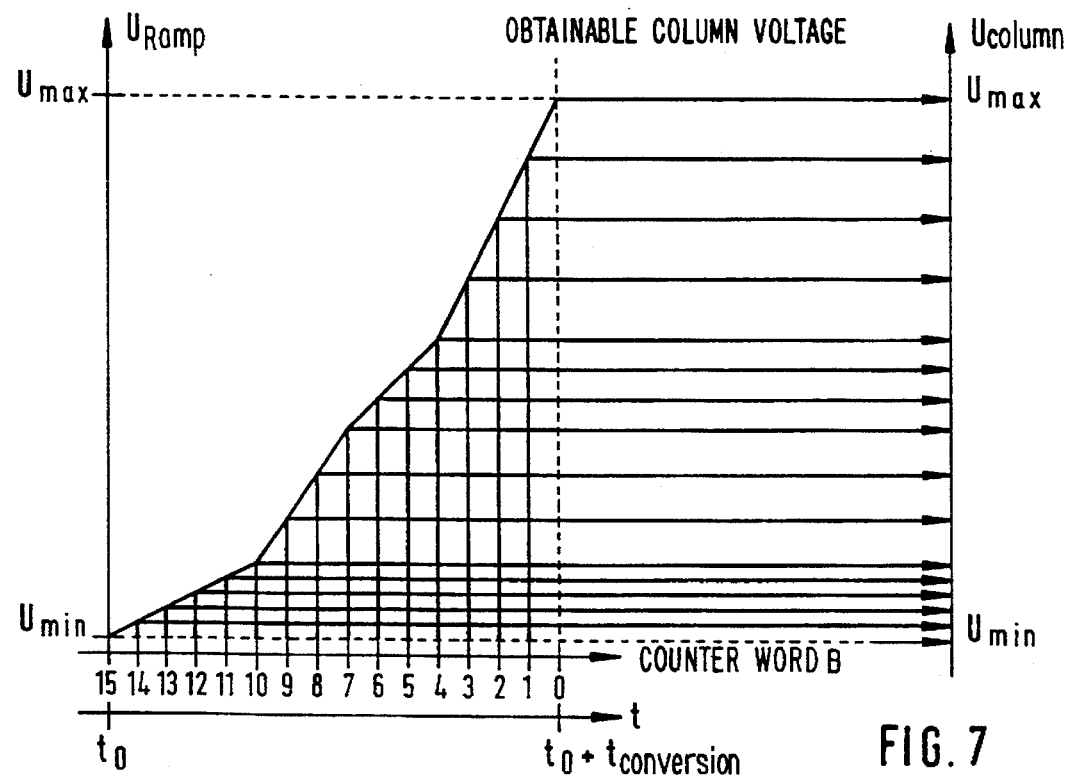
FIG. 7 is a graphical illustration of the time dependence of a reference voltage having a linear ramp-like time dependence.

FIGS. 6 and 7 show the time course of two forms of the reference voltage $U_{ramp}$. In FIG. 6 a linear voltage ramp, i.e. a reference voltage $U_{ramp}$ having a linear ramp-like time dependency, is shown. Since the time points for decrementing the counter word B are equal-spaced along the time axis, the resulting column voltage values $U_{column}$ are equally spaced. In FIG. 7, in contrast, the voltage $U_{ramp}$ has a nonlinear ramp-like time dependence. Because of that, also the column voltage values $U_{column}$ are distributed nonuniformly between the minimum value $U_{min}$ and the maximum value $U_{min}$. In the embodiment illustrated in FIG. 7 because of the comparatively gentle almost flat course of the ramp voltage time dependence at the beginning of the counting process, the resolution of the obtained values of the column voltage $U_{column}$ is comparatively high in the low voltage range.

Figure 8:
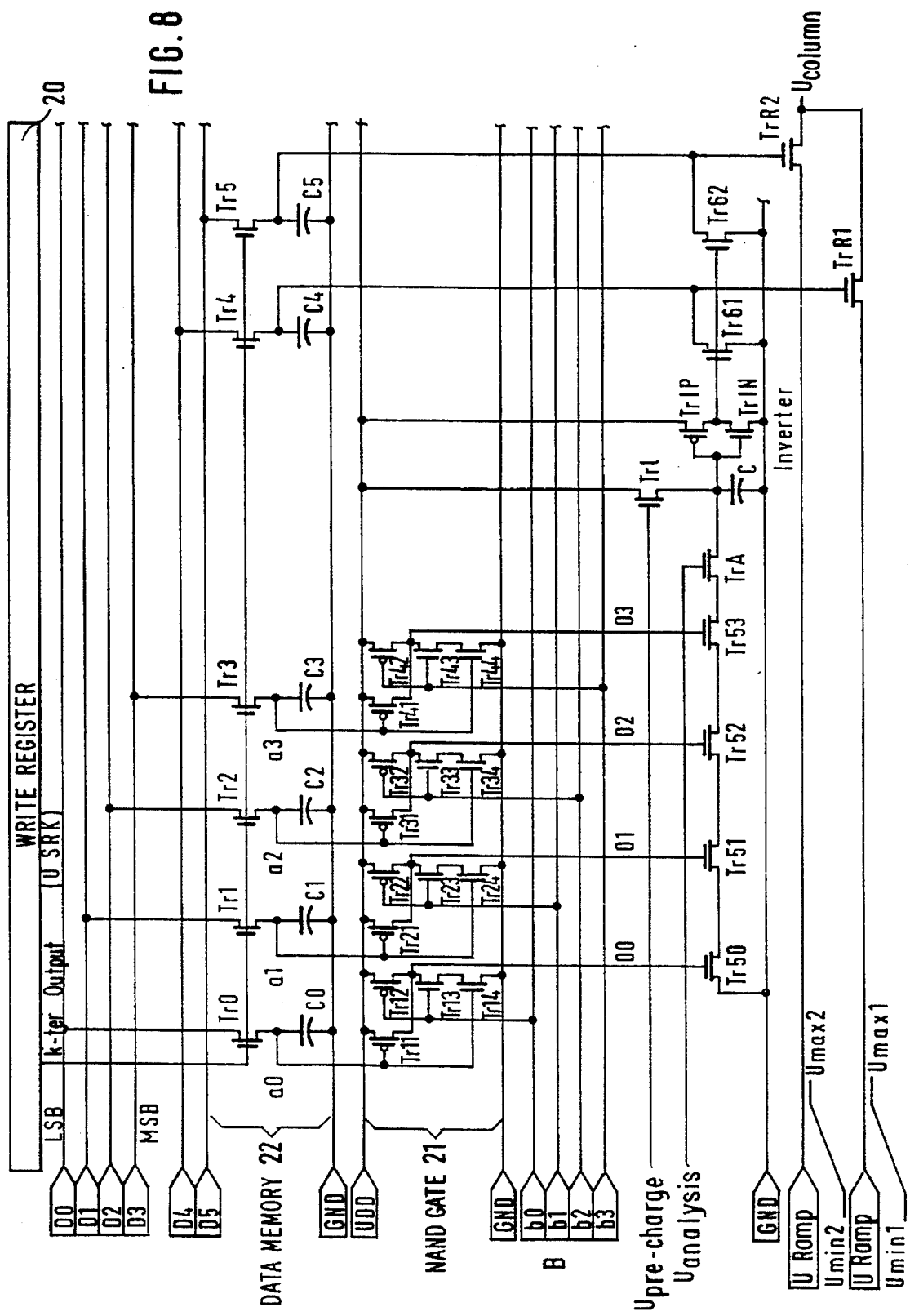
FIG. 8 is a schematic circuit diagram of another embodiment of a controller circuit of a data conductor of a liquid crystal display screen which permits selection between two reference voltages.

The circuit shown in FIG. 8 mostly corresponds to that shown in FIG. 4, but two different reference voltages $U_{ramp1}$ and $U_{ramp2}$ are supplied to it. The device can be switched arbitrarily between these two reference voltages. The choice of ramp voltages $U_{ramp1}$ or $U_{ramp2}$ is made by two data bits D4 and D5. The values of D4 and D5 are written into two memory capacitors C4 and C5. By writing the memory capacitor C4 with a high voltage and C5 with a low voltage, or vice versa, either the transistor TrR1 or TrR2 is made conducting, so that the column voltage values $U_{column}$ either correspond to $U_{ramp1}$ or $U_{ramp2}$. Since only one of the two ramp voltages $U_{ramp1}$ or $U_{ramp2}$ may be selected, only one of the ramp selection bits D4 or D5 may have the logic value "1". While the digital/analog conversion is occurring, the voltage $U_{ramp1}$ now runs through the range $U_{ramp1min}$ to $U_{ramp1max}$ and the voltage $U_{ramp2}$ now runs through the range $U_{ramp2min}$ to $U_{ramp2max}$. If $U_{ramp1min} < U_{ramp1max} < U_{ramp2min} < U_{ramp2max}$ is selected, then twice as many gray values can be made with the circuit of FIG. 8 than with the circuit shown in FIG. 4. Instead of the transistor TrR in the circuit of FIG. 4 now TrR1 and TrR2 are used. The transistors Tr61, Tr62 and an inverter are used to switch off transistors TrR1 and TrR2. As long as $U_c$ has a high voltage, the inverter output supplies a low voltage. Because of that, the transistors Tr61 and Tr62 are blocked, and the voltages supplied to the memory capacitors $C_4$ and $C_5$ are maintained unchanged. Now if C is discharged, the voltage at the inverter output changes to a high value $U_{DD}$ and the transistors Tr61 and Tr62, so that both memory capacitors $C_4$ and $C_5$ discharge. Because of that, the previously conducting transistors TrR1 and/or TrR2 are blocked and the subsequently obtained voltage value $U_{column}$ is maintained constant.

Figure 9:
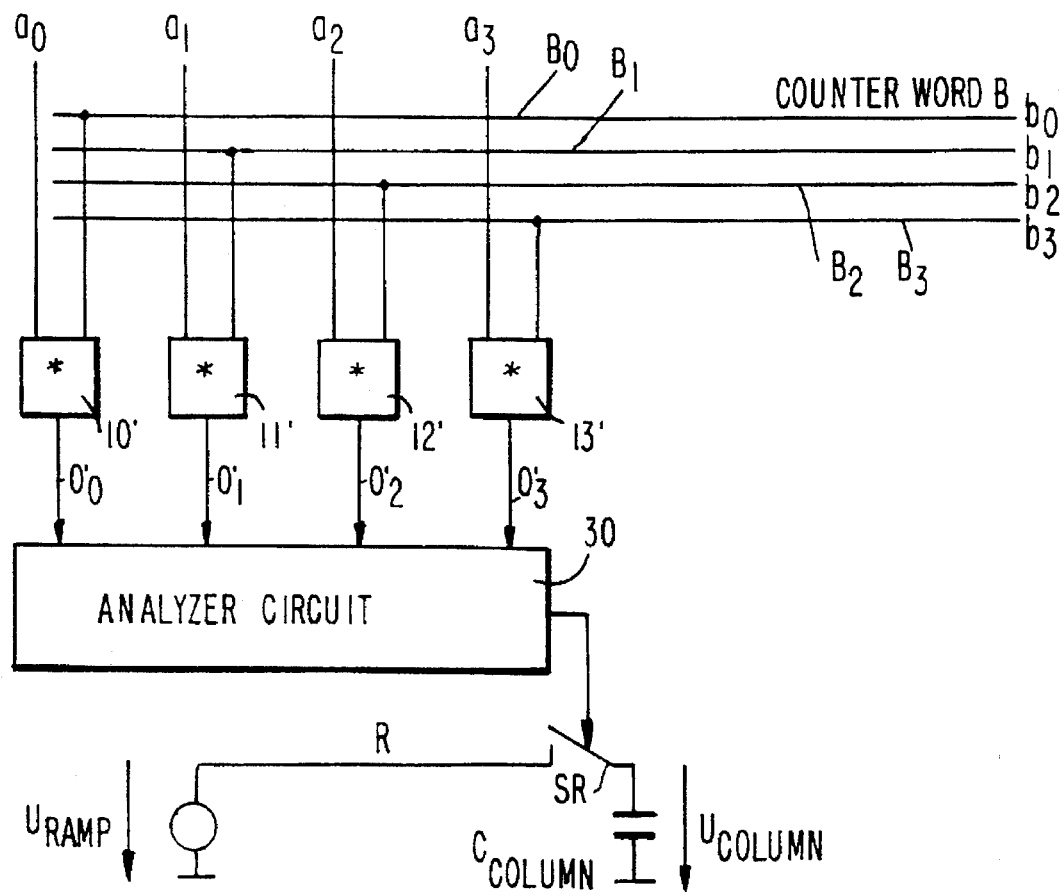
FIG. 9 is a generalized main circuit diagram of a controller circuit according to the invention.

A generalized circuit diagram showing the principal features of another embodiment of a digital/analog converter according to the invention appears in FIG. 9. This digital/analog converter is provided with logic connection circuit means for two words A and B having N=4 bits. The logic connection circuit means is selected from various possibilities including NAND, AND, OR and NOR. The generalized logic connection function of A and B is evaluated by the N-bit logic gate 10' to 13' in a bit-wise manner. Each logic gate element 10', 11', 12', 13' is designated with a "*". The outputs $O_0'$–$O_3'$ of the logic gate 10' to 13' are analyzed by the analyzer circuit 30, whose structure depends on the type of logic connective function used in the logic gate 10'–13'. It has the purpose of opening the switch SR as soon as all the outputs $O_0'$–$O_3'$ of the logic gate 10'–13' have a logical "1" and/or a logical "0". Since the analyzer circuit 30 for the logic connection function of A and B must detect only the first occurrence of $1111_{bin}$ and/or $0000_{bin}$ in at the gate outputs, it can be made with a reduced expense, e.g. by a capacitor which is charged as soon as B=$\overline{A}$.

Liquid crystal display screens, e.g. with digital video signals, can be controlled with circuit arrangements which operate according to the principles of the digital/analog conversion method of the invention. The image information is supplied digitally for all columns. The noise sensitivity may be greatly reduced using the digital techniques. Because of the input digital signals the circuit arrangement according to the invention is also very suitable for digital end devices, since, e.g., the signal processing in current television units is primarily digital and furthermore the television signal transmission is likely to occur digitally in the future. The digital/analog conversion occurs simultaneously for all columns of the image. This increases the write-in time for all column conductors. The control methods according to the invention provide the advantage of a resolution of N-bits between the largely arbitrary values $U_{min}$ and $U_{max}$. The digital/analog converter characteristic line is, in contrast to converter circuits with binary-weighted switched capacitance in which the ratio of the switched capacitance to the output capacitance determines the characteristic line, independent of the capacitive load at the output of the digital/analog converter. Furthermore in converters with binary-weighted switched capacitance the spatial requirement for the converter is proportional to $2^N$ of the gray stages produced, while in the digital/analog converters according to the invention the circuit expense increases only in proportion to N. The circuit arrangements according to the invention may be very satisfactorily manufactured in thin film technology in contrast to converters with R-2R-resistance networks, constant current sources and/or operational amplifiers. They are therefore very suitable for integration in a display screen substrate.

While the invention has been illustrated and described as embodied in a process and apparatus for conversion of an N-bit digital data word into an analog voltage value, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. A process of converting a digital data word having N-bits into an analog voltage value using an analog reference voltage having a ramp-shaped time dependence, said process comprising the steps of:

a) decrementing a counter word (B) having N-bits from a maximum value to form a series of decremented values;

b) synchronizing said decrementing of said counter word (B) to a time course of a reference voltage ($U_{ramp}$) having a ramp-shaped time dependence and evaluating a bit-wise logical connection function of said decremented values of said counter word (B) and a digital data word (A) to determine when one of said decremented values of said counter word (B) is equal to a complement of the digital data word (A); and c) setting an output analog voltage value ($U_{column}$) equal to said reference voltage ($U_{ramp}$) as soon as said one of said decremented values of said counter word (B) equal to said complement of said data word (A) is reached in step b).

2. The process as defined in claim 1, wherein said time course of said reference voltage ($U_{ramp}$) is nonlinear.

3. The process as defined in claim 1, wherein said reference voltage ($U_{ramp}$) is selected from a plurality of different reference voltage functions ($U_{ramp1}, U_{ramp1}$) each having a different time dependent behavior.

4. The process as defined in claim 1, wherein the logical connection function of the digital data word (A) and the decremented values of the counter word (B) is selected from the group consisting of AND-connection functions, NAND-connection functions, OR-connection functions and NOR-connection functions.

5. A circuit arrangement for performing a process of converting a digital data word having N-bits into an analog voltage value using an analog reference voltage having a ramp-shaped time dependence, said circuit arrangement comprising:

means for decrementing a counter word (B) having N-bits from a maximum value to form a series of decremented values;

means for synchronizing said decrementing of said counter word (B) to a time course of a reference voltage ($U_{ramp}$) having a ramp-shaped time dependence;

means for evaluating a logical connection function of said decremented values of said counter word (B) and a digital data word (A) to determine when one of said decremented values of said counter word (B) is equal to a complement of the digital data word (A), said means for evaluating said logical connection function including an N-bit logic gate (10'-13') having outputs ($O_0'-O_3'$); and means for setting an output analog voltage value ($U_{column}$) equal to said reference voltage ($U_{ramp}$) as soon as said one of said decremented values of said counter word (B) equal to said complement of said data word (A) is reached, wherein said means for setting includes an analyzer circuit (30) receiving output signals from said outputs ($O_0'-O_3'$) of said N-bit logic gate (10'-30').

6. The circuit arrangement as defined in claim 5, wherein said analyzer circuit (30) has at least one capacitor (C) and at most N+3 circuit components($S_0$ to $S_3$, $S_A$, $S_L$, $S_R$) besides said at least one capacitor (C).

7. The circuit arrangement as defined in claim 6, wherein said at most N+3 circuit components($S_0$ to $S_3$, $S_A$, $S_L$, $S_R$) are switches.

8. The circuit arrangement as defined in claim 5, made by thin film technology.

9. The circuit arrangement as defined in claim 7, made by thin film technology.

10. A digital control circuit for data conductors of a liquid crystal display screen with a matrix-like arrangement of image points, said digital control circuit comprising a data memory for a digital data word (A) for each data conductor; circuit arrangement comprising means for decrementing a counter word (B) having N-bits from a maximum value to form a series of decremented values, means for synchronizing said decrementing of said counter word (B) to a time course of a reference voltage ($U_{ramp}$) having a ramp-shaped time dependence, means for evaluating a logical connection function of said decremented values of said counter word (B) and a digital data word (A) to determine when one of said decremented values of said counter word (B) is equal to a complement of the digital data word (A), said means for evaluating said logical connection function including an N-bit logic gate (10'-13') having outputs ($O_0'-O_3'$), and means for setting an output analog voltage value ($U_{column}$) equal to a value of said reference voltage ($U_{ramp}$) as soon as said one of said decremented values of said counter word (B) equal to said complement of said data word (A) is reached; wherein said means for setting includes an analyzer circuit (30) receiving output signals from said outputs ($O_0'-O_3$) of the N-bit logic gate (10'-30') and a counter connected with all of said circuit arrangements for all of said data conductors.

11. The digital control circuit as defined in claim 10, further comprising a substrate including an image point matrix of a liquid crystal display screen made by a thin film technology process.

12. A process of converting a digital data word having N-bits into an analog voltage value using an analog reference voltage having a ramp-shaped time dependence, said process comprising the steps of:

a) incrementing a counter word (B) having N-bits from a minimum value to form a series of incremented values;

b) synchronizing said incrementing of said counter word (B) to a time course of a reference voltage ($U_{ramp}$) having a ramp-shaped time dependence and evaluating a bit-wise logical connection function of said incremented values of said counter word (B) and a digital data word (A) to determine when one of said incremented values of said counter word (B) is equal to a complement of the digital data word (A); and c) setting an output analog voltage value ($U_{column}$) equal to the reference voltage ($U_{ramp}$) as soon as said one of said incremented values of said counter word (B) equal to said complement of said data word (A) is reached in step b).

13. The process as defined in claim 12, wherein said time course of said reference voltage ($U_{ramp}$) is nonlinear.

14. The process as defined in claim 12, wherein said reference voltage ($U_{ramp}$) is selected from a plurality of different reference voltage functions ($U_{ramp1}, U_{ramp}$) with different time dependent behavior.

15. The process as defined in claim 12, wherein the logical connection function of the digital data word (A) and the incremented values of the counter word (B) is selected from the group consisting of AND-connection functions, NAND-connection functions, OR-connection functions and NOR-connection functions.

16. A circuit arrangement for performing a process of converting a digital data word having N-bits into an analog voltage value using an analog reference voltage having a ramp-shaped time dependence, said circuit arrangement comprising:

means for incrementing a counter word (B) having N-bits from a minimum value to form a series of incremented values;

means for synchronizing said incrementing of said counter word (B) to a time course of a reference voltage ($U_{ramp}$) having a ramp-shaped time dependence;

means for evaluating a logical connection function of said incremented values of said counter word (B) and a digital data word (A) to determine when one of said incremented values of said counter word (B) is equal to a complement of the digital data word (A), said means for evaluating said logical connection function including an N-bit logic gate (10'-13') having outputs ($O_0'-O_3'$); and means for setting an output analog voltage value ($U_{column}$) equal to said reference voltage ($U_{ramp}$) as soon as said one of said incremented values of said counter word (B) equal to said complement of said data word (A) is reached, wherein said means for setting includes an analyzer circuit (30) receiving output signals from said outputs ($O_0'-O_3'$) of said N-bit logic gate (10'-30').

17. The circuit arrangement as defined in claim 16, wherein said analyzer circuit (30) has at least one capacitor (C) and at most N+3 circuit components($S_0$ to $S_3$, $S_A$, $S_L$, $S_R$) besides said at least one capacitor (C).

18. The circuit arrangement as defined in claim 17, wherein said at most N+3 circuit components($S_0$ to $S_3$, $S_A$, $S_L$, $S_R$) are switches.

19. The circuit arrangement as defined in claim 16, made by thin film technology.

20. The circuit arrangement as defined in claim 18, made by thin film technology.

21. A digital control circuit for data conductors of a liquid crystal display screen with a matrix-like arrangement of image points, said digital control circuit comprising a data memory for a digital data word (A) for each data conductor; a circuit arrangement comprising means for incrementing a counter word (B) having N-bits from a minimum value to form a series of incremented values, means for synchronizing said incrementing of said counter word (B) to a time course of a reference voltage ($U_{ramp}$) having a ramp-shaped time dependence, means for evaluating a logical connection function of said incremented values of said counter word (B) with a digital data word (A) to determine when one of said incremented values of said counter word (B) is equal to a complement of the digital data word (A), said means for evaluating said logical connection function including an N-bit logic gate (10'-13') having outputs ($O_0'-O_3'$), and means for setting an output analog voltage value ($U_{column}$) equal to said reference voltage ($U_{ramp}$) as soon as said one of said incremented values of said counter word (B) equal to said complement of said data word (A) is reached, wherein said means for setting includes an analyzer circuit (30) receiving output signals from said outputs ($O_0'-O'$) of the N-bit logic gate (10'-30') and a counter connected with all of said circuit arrangements for all of said data conductors.

22. The digital control circuit as defined in claim 21, further comprising a substrate including an image point matrix of a liquid crystal display screen made by a thin film technology process.

* * * * *